United States Patent [19]

Anderson et al.

[11] 3,998,677

[45] Dec. 21, 1976

[54] TECHNIQUE FOR USING SOLDER ETCH RESIST IN GENERATION OF PATTERNS ON PRINTED WIRING BOARDS

[75] Inventors: David Verne Anderson, North Andover; Anthony John Cucinotta, Wakefiled, both of Mass.; Donald Lee Durand, Plaistow, N.H.

[73] Assignees: Western Electric Company, New York, N.Y.; Bell Telephone Laboratories Incorporated, Murray Hill, N.J.

[22] Filed: Nov. 21, 1974

[21] Appl. No.: 525,778

[52] U.S. Cl. .................................. 156/3; 75/166 D; 106/1; 156/13; 156/18; 427/96; 427/126; 427/287
[51] Int. Cl.² .......................................... C23F 1/02
[58] Field of Search .................. 29/628, 630 R; 75/166 D; 106/1, 240; 156/8, 13, 18, 3; 427/96, 126, 282, 287; 228/248

[56] References Cited

UNITED STATES PATENTS

| 3,476,624 | 11/1969 | Hogya et al. | 156/13 |
| 3,644,155 | 2/1972 | Hogya et al. | 156/13 |
| 3,684,533 | 8/1972 | Conwicke | 106/1 |

*Primary Examiner*—William A. Powell
*Attorney, Agent, or Firm*—Edward M. Fink

[57] ABSTRACT

A technique is described for the generation of a pattern on printed wiring boards bearing a layer of copper. The technique involves the use of a solder cream as an etch resist, the cream comprising a slurry of solder suspended in a curable resin flux. The use of the cream as an etch resist is similar to the use of either ink or solder plate for such purposes. However, the process described is far more economical than currently used techniques and provides a preferred alternative.

3 Claims, No Drawings

TECHNIQUE FOR USING SOLDER ETCH RESIST IN GENERATION OF PATTERNS ON PRINTED WIRING BOARDS

This invention relates to a technique for generating a pattern upon a printed wiring board bearing a layer of copper. More particularly, the present invention relates to a technique for etching copper bearing a solder cream etch.

In the fabrication of printed circuits, it is conventional to laminate copper foil to a plastic or fiber sheet impregnated with a bonding material and, subsequently, mask the copper with a resist material in areas destined for circuit use, the copper foil in unmasked areas being removed with an etchant. Resist materials utilized heretofore for such purposes have included printing inks, a wax or, more recently, solder plate. In the processing sequence the resist materials are not susceptible to attack by solder compatible copper etchants and so yield a copper resist network having the design of the desired electric circuit, the resist being readily removed if desired. The solder plate resist has become the most prominent of the prior art techniques, the solder remaining on the surface of the copper and serving not only as an etch resist, but also as a connection means to other portions of the circuit or design.

Although each of these prior art techniques has met with varying degrees of success, investigative efforts have continued with a view toward effecting economies in the processing scheme. In accordance with the present invention, this end has been successfully attained using solder cream as an etch resist. Briefly, the inventive technique involves screening a solder cream, including a curable resin in the flux, into a desired pattern upon an unetched printed wiring board, and subsequently, effecting curing of the cream. Following curing, the solder cream serves as an etch resist for copper in a manner similar to the solder plate, ink, or wax resists utilized heretofore.

The solder cream employed in the practice of the present invention comprises a slurry of solder particles suspended in a flux vehicle. These creams are readily available from commercial sources and typically include any of the conventional single or multiphase metals normally used for soldering, such as gold, silver, tin, antimony, lead, zinc, copper and so forth, and alloys and mixtures thereof. The vehicle chosen for use in conjunction with the solder metal particles comprises a rosin, an active hydrogen containing compound and a curing agent. Optional inclusions in the vehicle are an organic solvent and a thixotropic agent. The rosin employed comprises a mixture of isomeric diterpene acids, typically including abietic acid, and includes the acids in rosins, wood rosins and derivatives thereof, the purpose of the rosin being to increase the viscosity of the vehicle so that it acts as a flux. The rosin may conveniently be employed in an amount ranging from 45–50%, by weight, based upon the weight of the vehicle, practical considerations dictating the noted limits. The active hydrogen containing compound may be selected from among hydroxyl substituted aliphatic amines, hydroxyl substituted mononuclear aromatic amines, hydroxyl substituted polynuclear heterocyclic amines and so forth. This component is conveniently included in the mixture in an amount ranging from 1–10% based on the weight of the vehicle, such range not being absolute and being dictated solely by practical considerations.

As indicated previously, the organic solvent is an optional element in the vehicle and when present may be employed in an amount ranging up to about 75% by weight. Likewise, the thixotropic agent is an optional ingredient serving solely to increase the viscosity of the vehicle. When present, the thixotropic agent is employed in an amount ranging up to 9% by weight based upon the weight of the vehicle. Any of the commercially available materials suitable for such purposes may be employed, a typical solvent being diethylene glycol manobutyl ether and the like and thixotropic agents such as diethylene glycol and the like may be employed.

In addition to the foregoing components, there is included in the vehicle a curing agent such as ethylene glycol manobutyl ether and the like. The curing agent is employed in an amount ranging from 3–9% by weight based on the weight of the mixture, such range being dictated by film hardness, curing rate and curing temperatures.

The solder metal particles of the type described above are used in particle form wherein the particles are rated at 325 mesh, a size sufficient to pass through a 180 mesh screen. The solder cream is conveniently prepared by admixing the above noted solder metals, in particle form, and the vehicle in sufficient quantities to yield a composition comprising from 80–85% by weight, vehicle. Studies have revealed that the preferred solder particles for use in the practice of the present invention comprise an alloy of tin and lead containing from 55–70% by weight tin, remainder lead.

Substrates chosen for use are copper clad laminated sheets comprising electroplated laminates constructed of two or more layers of porous filler material impregnated with a synthetic resin and cured by heating under pressure to a hard uniform sheet. Following curing, electro-deposited copper foil is positioned on one or both sides of the structure, the copper thickness ranging from 0.0014 to 0.0070 inches. The total thickness of the laminate ranges from one-thirty second to one-fourth of an inch.

In the operation of the process, solder cream, obtained from commercial sources, is screened in a desired pattern upon an unetched copper clad printed wiring board laminated by means of screening techniques employing a screen mesh size of 180. Following, the screened solder cream pattern is cured in an oven, typically a hot air oven similar to that employed to cure screened ink. It will be appreciated that the curing temperature therein is not critical and may range up to temperatures just below the fusion temperature of solder. However, for preferred image definition, a temperature range from 170°–200° F dependant upon flux system is employed. The lower limit is dictated by considerations relating to curing time. In a preferred embodiment for curing of a 60–40 tin-lead solder alloy suspended in a vehicle comprising a curing agent, curing was effected in approximately 10 minutes at 180° F.

Next, exposed copper is etched with a standard alkaline etchant, for example, a peroxydisulfate of amonium, sodium, lithium, or the like containing phosphoric acid. The printed wiring boards may then be stacked and subjected to normal production handling without the necessity for reflow soldering immediately after etching. When ready for use, the resultant boards are subjected to reflow soldering in a conventional reflow solder machine at temperatures within the range of 400° to 500° F for time periods ranging from 40 to 120 seconds. It will be appreciated that the described process can also be employed on printed wiring boards requiring gold finger contacts, such boards requiring solder in specific areas. In such cases, following the etch step, the solder cream is stripped from the gold finger areas by the use of a solvent such as trichloroethylene, and before or after reflow soldering the gold fingers are deposited by standard plating techniques.

The resultant structure is now ready for use in the fabrication of structures suitable for use in the electronics industry.

What is claimed is:

1. A method for etching a copper surface which comprises the steps of
   a. depositing a resist upon a copper surface in a pattern, exposed copper being destined for etching, the resist being a solder cream comprising a slurry of solder particles suspended in a flux vehicle comprising a rosin, an active hydrogen containing compound and curing agent, the vehicle comprising from 80–85% by weight of the solder cream,
   b. curing the solder cream at a temperature ranging from 170°–200° F, and
   c. etching exposed copper.

2. Method in accordance with claim 1 wherein the copper surface is a copper clad laminate constructed of at least two layers of porous filler impregnated with a synthetic resin.

3. A method in accordance with claim 1 wherein the solder particles comprises an alloy of tin and lead containing from 55–70% by weight tin, remainder lead.

* * * * *